(12) United States Patent
Grill et al.

(10) Patent No.: US 8,981,466 B2
(45) Date of Patent: *Mar. 17, 2015

(54) MULTILAYER DIELECTRIC STRUCTURES FOR SEMICONDUCTOR NANO-DEVICES

(71) Applicant: International Business Machines Corporation, Armonk, NY (US)

(72) Inventors: Alfred Grill, White Plains, NY (US); Seth L. Knupp, Schenectady, NY (US); Son V. Nguyen, Schenectady, NY (US); Vamsi K. Paruchuri, Clifton Park, NY (US); Deepika Priyadarshini, Guilderland, NY (US); Hosadurga K. Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/792,374

(22) Filed: Mar. 11, 2013

(65) Prior Publication Data

US 2014/0252502 A1    Sep. 11, 2014

(51) Int. Cl.
| | |
|---|---|
| H01L 21/283 | (2006.01) |
| H01L 21/3115 | (2006.01) |
| H01L 21/473 | (2006.01) |
| H01L 21/02 | (2006.01) |
| H01L 29/66 | (2006.01) |
| H01L 29/78 | (2006.01) |

(52) U.S. Cl.
CPC .... *H01L 21/02123* (2013.01); *H01L 21/02126* (2013.01); *H01L 21/02164* (2013.01); *H01L 21/02247* (2013.01); *H01L 29/6656* (2013.01); *H01L 29/7833* (2013.01); *H01L 29/7843* (2013.01); *H01L 29/665* (2013.01)
USPC ........... 257/330; 438/763; 438/786; 438/639; 438/296; 438/270; 438/437; 438/624; 438/791; 438/687; 257/408; 257/506; 257/637; 257/639; 257/640; 257/698; 257/702; 257/760; 257/762

(58) Field of Classification Search
CPC ........................ H01L 21/02123; H01L 29/78
USPC .................. 257/411, 639; 438/591, 763, 786
See application file for complete search history.

(56) References Cited

U.S. PATENT DOCUMENTS

| | | | |
|---|---|---|---|
| 6,407,002 B1 * | 6/2002 | Lin et al. | 438/713 |
| 6,982,472 B2 | 1/2006 | Kiyotoshi | |
| 7,022,561 B2 | 4/2006 | Huang et al. | |
| 7,232,730 B2 | 6/2007 | Chen et al. | |
| 7,235,453 B2 | 6/2007 | Kim | |
| 7,279,746 B2 | 10/2007 | Doris et al. | |
| 7,824,990 B2 | 11/2010 | Chang et al. | |
| 2004/0188762 A1 * | 9/2004 | Shimamoto et al. | 257/350 |
| 2007/0063348 A1 * | 3/2007 | Yang et al. | 257/751 |

(Continued)

*Primary Examiner* — Olik Chaudhuri
*Assistant Examiner* — Christine Enad
(74) *Attorney, Agent, or Firm* — Daniel P. Morris; Ryan, Mason & Lewis, LLP

(57) ABSTRACT

Multilayer dielectric structures are provided having silicon nitride (SiN) and silicon oxynitride (SiNO) films for use as capping layers, liners, spacer barrier layers, and etch stop layers, and other components of semiconductor nano-devices. For example, a semiconductor structure includes a multilayer dielectric structure having multiple layers of dielectric material including one or more SiN layers and one or more SiNO layers. The layers of dielectric material in the multilayer dielectric structure have a thickness in a range of about 0.5 nanometers to about 3 nanometers.

15 Claims, 6 Drawing Sheets

(56) References Cited

U.S. PATENT DOCUMENTS

| | | | |
|---|---|---|---|
| 2007/0120154 A1* | 5/2007 | Zhu et al. | 257/288 |
| 2007/0207628 A1* | 9/2007 | Chua | 438/769 |
| 2008/0064173 A1* | 3/2008 | Hung | 438/299 |
| 2008/0076268 A1* | 3/2008 | Kraus et al. | 438/785 |
| 2008/0166854 A1* | 7/2008 | Shin et al. | 438/427 |
| 2009/0014778 A1 | 1/2009 | Kawashima et al. | |
| 2009/0079016 A1 | 3/2009 | Chen et al. | |
| 2009/0224374 A1* | 9/2009 | Bhatia et al. | 257/635 |
| 2009/0289291 A1* | 11/2009 | Cheng et al. | 257/301 |
| 2010/0065901 A1* | 3/2010 | Tran et al. | 257/316 |
| 2010/0087052 A1* | 4/2010 | Xu | 438/530 |
| 2010/0221925 A1* | 9/2010 | Lee et al. | 438/792 |
| 2010/0230777 A1* | 9/2010 | Teo et al. | 257/506 |
| 2010/0283097 A1* | 11/2010 | Endoh et al. | 257/324 |
| 2011/0006390 A1* | 1/2011 | Huang et al. | 257/510 |
| 2011/0031538 A1* | 2/2011 | Hsieh et al. | 257/288 |
| 2011/0187000 A1* | 8/2011 | West | 257/751 |
| 2012/0025297 A1 | 2/2012 | Takashima et al. | |
| 2013/0119451 A1* | 5/2013 | Rogers et al. | 257/316 |
| 2013/0221494 A1* | 8/2013 | Ramachandran et al. | 257/621 |

* cited by examiner

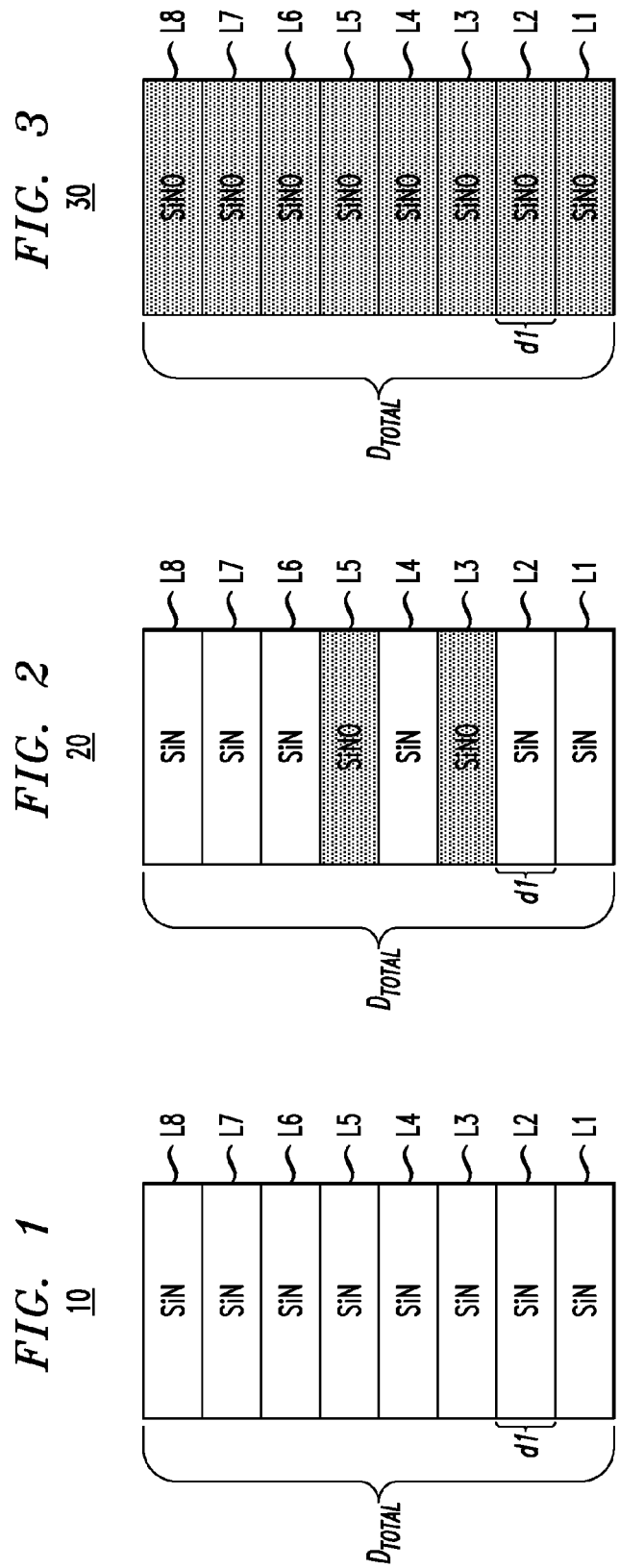

US 8,981,466 B2

MULTILAYER DIELECTRIC STRUCTURES FOR SEMICONDUCTOR NANO-DEVICES

TECHNICAL FIELD

The field relates generally to methods for fabricating multilayer dielectric structures comprising a stack of silicon nitride (SiN) and silicon oxynitride (SiNO) films, as well as semiconductor nano-devices having structures such as capping layers, liners, spacers, barrier layers, and etch stop layers, etc., formed of multilayer SiN/SiNO dielectric structures.

BACKGROUND

Various semiconductor integrated circuits include devices that are formed with layers of dielectric or insulating material. These dielectric/insulating layers are used as stress controlling films, barrier layers, liner layers, and capping layers, for example, for fabricating nano-devices and structures in front end of line (FEOL) and back end of the line (BEOL) processes. As feature sizes and line rules become increasingly smaller, it becomes increasingly necessary to implement thinner dielectric and insulating layers with lower dielectric constants, higher voltage break down strengths, and improved leakage characteristics. Moreover, as dielectric and insulating layers are made increasingly thinner for certain applications, these dielectric and insulating layers must be able to withstand damage due to subsequent processing steps, such as damage or loss due to plasma exposures (e.g., reactive ion etch (RIE), strip, dielectric barrier etch, and wet cleans (e.g., post RIE dilute hydrofluoric (DHF) cleans).

SUMMARY

Embodiments of the invention generally include methods for fabricating multilayer dielectric stack structures comprising SiN and SiNO films, as well as semiconductor nano-devices having structures such as capping layers, liners, spacer barrier layers, and etch stop layers, etc., formed of multilayer SiN/SiNO dielectric structures.

In one embodiment of the invention, a semiconductor structure includes a multilayer dielectric structure having multiple layers of dielectric material. The layers of dielectric material include one or more SiN layers and one or more SiNO layers. In another embodiment, a semiconductor structure includes a multilayer dielectric structure having multiple layers of dielectric material, wherein each layer of dielectric material is a SiNO layer. In yet another embodiment of the invention, each SiNO and SiN layer in a multilayer dielectric structure has a thickness in a range of about 0.5 nanometers to about 3 nanometers.

Other embodiments of the present invention will become apparent from the following detailed description, which is to be read in conjunction with the accompanying drawings.

BRIEF DESCRIPTION OF THE DRAWINGS

FIG. 1 shows a multilayer dielectric structure comprising a plurality of SiN layers.

FIG. 2 shows a multilayer dielectric structure comprising a plurality of SiN and SiNO layers, according to an embodiment of the invention.

FIG. 3 shows a multilayer dielectric structure comprising a plurality of SiNO layers, according to another embodiment of the invention.

DETAILED DESCRIPTION

Figure 5:
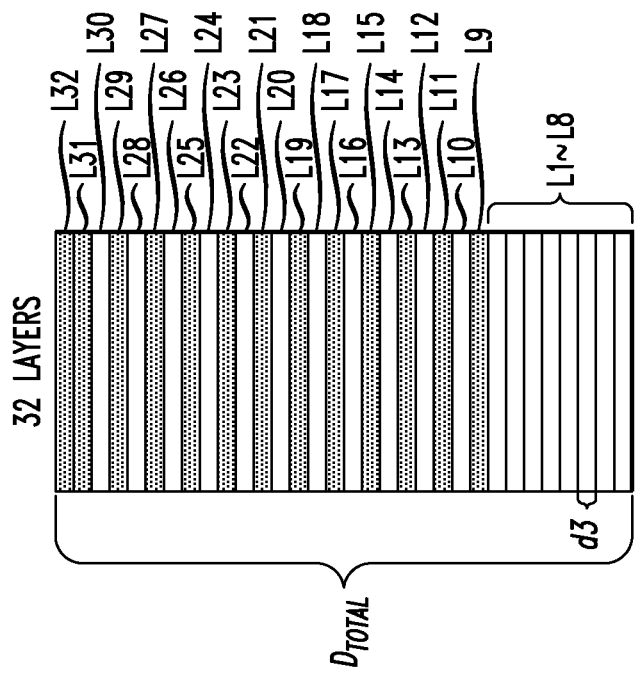
FIG. 5 shows a multilayer dielectric structure comprising a plurality of SiN and SiNO layers, according to another embodiment of the invention.

Embodiments of the invention will now be described in further detail with regard to methods for fabricating multilayer dielectric stack structures comprising SiN and SiNO films, as well as semiconductor nano-devices having structures such as capping layers, liners, spacers barrier layers, and etch stop layers, etc., formed of multilayer SiN/SiNO dielectric structures.

FIG. 1 shows a multilayer dielectric structure comprising a plurality of SiN layers. In particular, FIG. 1 shows a stack of eight SiN layers (L1, L2, L3, L4, L5, L6, L7 and L8) forming the multilayer dielectric structure 10. As shown in FIG. 1, each SiN layer L1~L8 has the same or similar thickness d1, and the multilayer dielectric structure 10 has a total thickness $D_{total}$. In one embodiment, each SiN layer in the multilayer dielectric structure 10 of FIG. 1 has a thickness d1 in a range of about 0.5 nm to about 3 nm, wherein the multilayer dielectric structure 10 has an overall total thickness $D_{total} \leq 25$ nm. For example, assuming that each SiN layer has a thickness d1=20 angstroms (2 nm), the total thickness of the multilayer dielectric structure 10 would be $D_{total}$=160 angstroms (16 nm). Each layer of dielectric material L1~L8 in the multilayer dielectric structure 10 can be conformal.

A multilayer SiN dielectric structure, such as shown in FIG. 1, is formed using dielectric film deposition techniques, which enable the formation of highly conformal and stress controlled multilayer ultrathin SiN dielectric structures that are suitable for use as stressor liners (stress controlled films), barrier/liner layers, and capping layers, for example, which can be used for fabricating nano-devices in FEOL and BEOL applications. In general, each SiN layer in a multilayer SiN dielectric structure is formed with a process that includes depositing a conformal SiN film using a plasma enhanced chemical vapor deposition (PECVD) process followed by a modulated radio frequency (RF) plasma nitridation treatment.

In one embodiment, the deposition of a SiN dielectric film is performed with a mixture of $SiR_4$ and $NH_3$ reactant gases at suitable standard cubic centimeters per minute (SCCM) flow rates, and using a low RF power and low temperature PECVD process or plasma enhanced atomic layer deposition (PE-ALD) process to form a conformal layer of SiN having a thickness in a range of about 0.5 nm to about 3 nm. For example, in one embodiment, the SiN deposition process is performed at a temperature of less than about 450 degrees Centigrade, and a radio frequency power of less than about 2 watts per square centimeter, with a radio frequency ranging from about 400 KHz to about 60 MHz. This deposition process results in the formation of an ultrathin, highly conformal SiN film.

Thereafter, a modulated RF plasma nitridation process is performed on the deposited SiN film. In one embodiment, plasma nitridation is performed using a nitrogen bearing reactant gas such as $N_2$ or $NH_3$, along with an inert gas such as Argon (Ar) or Helium (He). The plasma nitridation process serves to make the thin SiN film more dense by low energy plasma ion bombardment, and to change a stress characteristic of the thin SiN film (compressive⇆tensile). Moreover, the plasma nitridation process can serve to adjust other characteristics of the thin SiN film such as, e.g., increase a breakdown voltage, reduce leakage, and/or slightly lower the dielectric constant, k, of the SiN film. The SiN deposition and plasma nitridation steps are repeated for each layer of SiN dielectric material that is added to form a multilayer SiN dielectric stack structure having a desired total thickness.

A multilayer SiN dielectric structure (such as shown in FIG. 1) that is formed by the above-described SiN deposition and plasma nitridation process provides various advantages over conventional SiN dielectric films that are formed with only one or two SiN layers using conventional PECVD deposition techniques. For example, SiN films that are formed with conventional PECVD deposition techniques do not provide good step coverage (e.g., <50% conformality), as it is difficult to deposit 5-10 nm thick conformal SiN films using such technologies due to the high deposition rate. In contrast, a multilayer SiN dielectric structure that is formed using the above-described process can result in a highly conformal SiN dielectric structure that provides good step coverage with a conformality of about 70 percent or greater. As such, a multilayer SiN dielectric structure is particularly useful in various application such as low temperature dielectrics stressor films for FEOL structures, copper capping layers in BEOL structures, and ultrathin spacers for nano transistor devices, as well as liner/barrier layers for shallow trench isolation structures, through-silicon via (TSV) structures, and copper damascene recess structures in BEOL structures. By way of specific example, a multilayer SiN dielectric structure that is formed using the above-described process can provide excellent gap filling characteristics for Cu damascene recess structures in, e.g., sub-50 nm Cu-ULK (Ultra low-k) BEOL interconnect structures. Furthermore, a multilayer SiN dielectric structure can provide improved stress stability despite UV exposure, provide a good oxidation barrier when used as a ultrathin capping layer in BEOL applications, provide high breakdown voltage, and/or minimal or no damage at the interface between a ULK inter-level dielectric layer and a SiN capping layer due to initial low RF plasma deposition power that is used in the SiN dielectric deposition process.

While a multilayer SiN dielectric structure as described above provides desirable features/characteristics such as a high EM barrier, high breakdown voltage and low leakage current, it is difficult to reduce the effective dielectric constant of a multilayer SiN dielectric structure (such as shown in FIG. 1) below around 6 simply by adjusting the parameters of the SiN deposition and nitridation processes. However, for the next generation 14/10/7 nm technology nodes, it is highly desirable to provide dielectric layers with dielectric constants that are less than 6 so as to provide SiN-based dielectric layers with reduced capacitance for use in nano-devices and structures that are fabricated using the next generation 14/10/7 nm technologies. Moreover, with capping layer applications, for example, a conformal multilayer SiN layer should have a minimum thickness of about 12-14 nm to provide good oxidation and Cu diffusion barrier properties. However, for next generation 14/10/7 nm technology nodes, capping layers are needed which are less than 12-14 nm in thickness, while providing the desired oxidation and Cu barrier properties for future nodes. One or more embodiments of the invention advantageously provide a very thin (≤30 nm) robust Cu barrier diffusion barrier cap suitable for meeting the device performance requirements of interconnect structures for the next generation 14/10/7 nm technology nodes.

FIG. 2 shows a multilayer dielectric structure comprising a plurality of SiN and SiNO layers, according to an embodiment of the invention. In particular, FIG. 2 shows a multilayer dielectric structure 20 comprising a stack of eight layers of dielectric material (L1, L2, L3, L4, L5, L6, L7 and L8), wherein the plurality of layers of dielectric material comprise one or more SiN layers and one or more SiNO layers. In the example embodiment shown in FIG. 2, the multilayer dielectric structure 20 comprises two SiNO layers (i.e., layers L3 and L5) and six SiN layers (i.e., layers L1, L2, L4, L6, L7, and L8), wherein each layer of dielectric material L1~L8 has the same or similar thickness d1, and wherein the multilayer dielectric structure 20 has a total thickness $D_{total}$. For example, in one embodiment, each SiN and SiNO layer in the multilayer dielectric structure 20 of FIG. 2 has a thickness d1 in a range of about 0.5 nm to about 3 nm, with an overall total thickness $D_{total}$<25 nm. Each layer of dielectric material L1~L8 in the multilayer dielectric structure 20 can be conformal.

As compared to the multilayer dielectric structure 10 of FIG. 1, the multilayer dielectric structure 20 of FIG. 2 with one or more SiNO layers provides a dielectric layer with a lower effective dielectric constant, $k_{eff}$, for the same total thickness $D_{total}$. In particular, the effective dielectric constant, $k_{eff}$, for a multilayer dielectric stack is determined as follows:

$$k_{eff} = \frac{D_{total}}{\frac{D_1}{k_1} + \frac{D_2}{k_2} + \ldots + \frac{D_n}{k_n}}$$

where $D_{total}$ is the total thickness of the multilayer dielectric stack comprising n layers, wherein $D_1, D_2, \ldots, D_n$ denote the thickness of each individual layer, respectively, of n total layers, and wherein $k_1, k_2, \ldots, k_n$ denote the dielectric constant of each individual layer, respectively, of n total layers. A layer of SiN has a dielectric constant k~6 and a layer of SiNO has a dielectric constant k~4.5. In the example embodiments of FIGS. 1 and 2 wherein each multilayer dielectric structure 10 and 20 has a $D_{total}$ =160 angstroms, wherein a thickness $D_1, D_2, \ldots, D_8$ of each layer L1, L2, ... L8 is d1=20 angstroms (2 nm), the multilayer dielectric structure 10 (FIG. 1) comprising eight layers of SiN would have an effective dielectric constant $k_{eff}$=6, while the multilayer dielectric structure 20 (FIG. 2) comprising two layers of SiNO and six layers of SiN would have an effective dielectric constant $k_{eff}$=5.54. The effective dielectric constant $k_{eff}$ would decrease for each additional layer of SiNO added in place of a SiN layer in the multilayer dielectric structure 20 of FIG. 2.

FIG. 3 shows a multilayer dielectric structure comprising a plurality of SiNO layers, according to another embodiment of the invention. In particular, FIG. 3 shows a multilayer dielectric structure 30 comprising a stack of eight layers (L1, L2, L3, L4, L5, L6, L7, and L8) of SiNO dielectric material have the same or similar thickness d1, wherein the multilayer dielectric structure 30 has a total thickness $D_{total}$. For example, in one embodiment, each SiNO layer in the multilayer dielectric structure 30 of FIG. 3 may have a thickness d1 in a range of about 0.5 nm to about 3 nm, with an overall total thickness $D_{total}$≤25 nm. Each SiNO layer L1~L8 in the multilayer dielectric structure 30 can be conformal.

Assuming that each layer of SiNO has a dielectric constant k~4.5, the multilayer dielectric structure 30 of FIG. 3 would have an effective dielectric constant $k_{eff}$=4.5. Thus, for the same total thickness $D_{total}$=160 angstroms, for example, of the multilayer dielectric structures 10 and 20 discussed above, the effective dielectric constant $k_{eff}$ of the multilayer dielectric structure 30 of FIG. 3 is significantly lower. Each SiNO layer of the dielectric structure shown in FIG. 3 may be conformal.

Moreover, the inclusion of SiNO layers in place of SiN layers in the multilayer dielectric structure 10 shown in FIG. 1 not only reduces the effective dielectric constant $k_{eff}$ of the dielectric stack as discussed above, but also allows for an overall reduction in the total thickness of the dielectric stack. For example, while the multilayer SiN/SiNO dielectric structures 20 and 30 shown in FIGS. 2 and 3 include eight layers, a multilayer SiN/SiNO dielectric structure can be formed of seven or less layers, while having an effective dielectric constant $k_{eff}$ of less than 6. For example, one of the SiN layers in the multilayer SiN/SiNO dielectric structure 20 of FIG. 2 can be removed to reduce the total thickness to $D_{total}$=140 angstroms (where it is assumed that the thickness d1 of each layer is 20 angstroms (2 nm)), while providing an effective dielectric constant $k_{eff}$ of about 5.47. The reduction in the total thickness of the multilayer SiN/SiNO dielectric structure coupled with a lower effective dielectric constant $k_{eff}$ effectively reduces capacitance in applications where, for example, the multilayer SiN/SiNO dielectric structure is used a capping layer (as discussed below).

Figure 4:
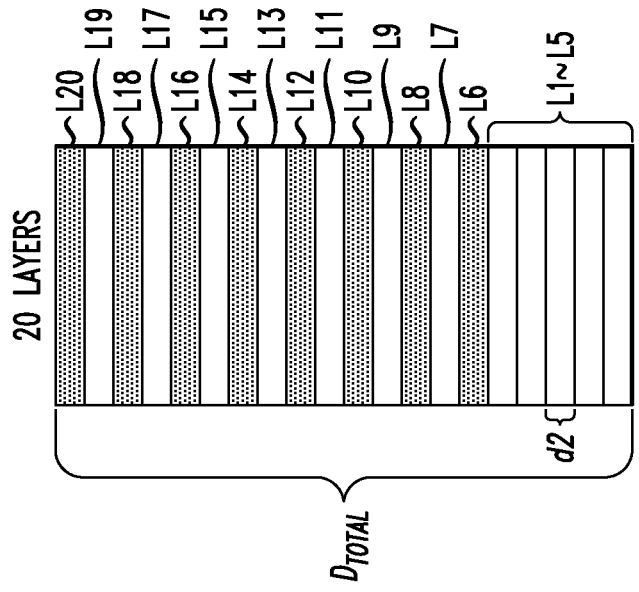
FIG. 4 shows a multilayer dielectric structure comprising a plurality of SiN and SiNO layers, according to another embodiment of the invention.

In other embodiments of the invention, for the same total thickness $D_{total}$=160 angstroms of the multilayer SiN/SiNO dielectric structures 10, 20 and 30 shown in FIGS. 1, 2, and 3, a multilayer SiN/SiNO dielectric structure (such as shown in FIGS. 4 and 5) can be fabricated having more than eight layers SiN/SiNO or SiNO, but having thinner SiN/SiNO or SiNO layers which provide added benefits, as discussed below. FIG. 4 shows a multilayer SiN/SiNO dielectric structure 40 comprising twenty layers of dielectric material, wherein eight of the layers (i.e., layers L6, L8, L10, L12, L14, L16, L18, and L20) are SiNO layers and wherein the remaining twelve layers (i.e., layers L1~L5, L7, L9, L11, L13, L15, L17, and L19) are SiN layers. Further, FIG. 5 shows a multilayer SiN/SiNO dielectric structure 50 comprising thirty-two layers of dielectric material, wherein thirteen of the layers (i.e., layers L9, L11, L13, L15, L17, L19, L21, L23, L25, L27, L29, L31 and L32) are SiNO layers and wherein the remaining 19 layers (i.e., layers L1~L8, L10, L12, L14, L16, L18, L20, L22, L24, L26, L28 and L30) are SiN layers. In example embodiments of FIGS. 4 and 5, the multilayer SiN/SiNO dielectric structures 40 and 50 have total thickness $D_{total}$=160 angstroms, but wherein each dielectric layer in the multilayer SiN/SiNO dielectric structure 40 of FIG. 4 has a thickness d2=8 angstroms, and wherein each dielectric layer in the multilayer SiN/SiNO dielectric structure 50 of FIG. 5 has a thickness d3=5 angstroms.

Figure 6A:
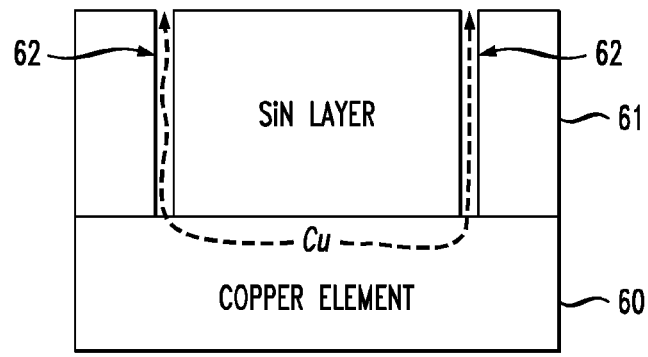
FIG. 6A schematically shows a diffusion path of copper atoms through a single SiN layer formed on top of a copper element.
Figure 6B:
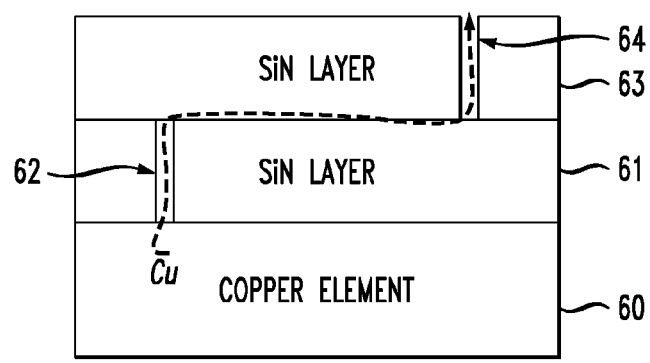
FIG. 6B schematically shows a diffusion path of copper atoms in a multilayer dielectric structure comprising two SiN layers formed on top of a copper element.
Figure 6C:
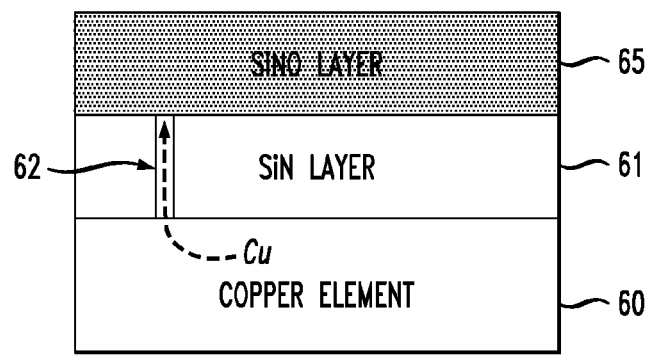
FIG. 6C schematically shows a diffusion path of copper atoms in a multilayer dielectric structure comprising layers of SiN and SiNO formed on top of a copper element, according to an embodiment of the invention.

In the multilayer SiN/SiNO dielectric structures 40 and 50 of FIGS. 4 and 5, the effective dielectric constant $k_{eff}$ does not change by increasing the number of dielectric layers if the ratio of the number of SiN to SiNO layers remains the same, but increasing a number of layers and interfaces in the stack structure provides benefits such (i) enhanced oxidation barrier properties, (ii) reduction in pinholes; (iii) lower compressive stress (iv) increase in breakdown voltage; (v) reduction in leakage current; and (vi) reduction in dielectric chamfering due to enhanced etch selectivity/etch stop cap. Moreover, by making the SiN and SiNO layers thinner, and building the multilayer dielectric structure to a desired total thickness, better overall conformality can be obtained, as each thin SiN and SiNO layer can be individually formed with high conformality. FIGS. 6A, 6B, and 6C schematically illustrate copper diffusion/oxidation pathways of different dielectric layer structures. FIG. 6A schematically shows a diffusion path of copper atoms from a copper element 60 through a single SiN dielectric layer 61 formed on top of the copper element 60. As shown in FIG. 6A, the SiN layer 61 comprises one or more pinhole defects 62 that extend through the SiN layer 61, and through which copper atoms (or an external oxidant) can diffuse from the copper element 60 (or other structure) to the material of some structure formed on top of the SiN layer 61. The single SiN dielectric structure shown in FIG. 6A provides poor diffusion/oxidation barrier film protection.

Further, FIG. 6B schematically shows a diffusion path of copper atoms from the copper element 60 through a multilayer dielectric structure comprising first and second conformal layers of SiN 61 and 63 formed on top of the copper element 60. While both SiN layers 61 and 63 are shown to have pinhole defects 62 and 64, the pin holes 62 of the first SiN layer 61 are not aligned to the pinholes 64 of the second layer 63, such that there is no straight, direct path for diffusion of copper atoms (or external oxidants) through the pinhole defects 62 and 64 in the stack of SiN layers 61 and 63, respectively. However, the copper atoms and external oxidants can diffuse from the pinhole defect 62 of the first SiN layer 61 to the pinhole defect 64 of the second SiN layer 63 along an interface between the first and second SiN layers 61 and 63. As compared to the structure of FIG. 6A, however, the structure of FIG. 6B provides improved Cu diffusion and oxidation barrier film protection.

Further, FIG. 6C schematically shows a diffusion path of copper atoms from the copper element 60 through a multi-layer dielectric structure comprising a conformal layer of SiN 61 and a conformal layer of SiNO 65 formed on top of the copper element 60. While the SiN layer 61 is shown to have pinhole defects 62, the SiNO layer 65 does not have pinhole defects, due to an oxidation process that is used to form the SiNO layer 65, as will be discussed in further detail below with reference to FIG. 12. While copper atoms and external oxidants can diffuse from through the pinhole defect 62 of the SiN layer 61, the SiNO layer provides an effective barrier to prevent further diffusion through the dielectric stack 61/65 due to the absence of pinhole defects in the SiNO layer 65. Thus, as compared to the structures of FIGS. 6A and 6B, the structure of FIG. 6C provides enhanced Cu diffusion and oxidation barrier film protection.

Furthermore, as noted above, while the ratio of the number of SiN to SiNO layers in a multilayer stack can be adjusted to change the effective dielectric constant (as discussed above), other factors are considered for positioning SiNO and SiN layers in a multilayer dielectric structure. For example, in applications where a multilayer SiN/SiNO stack is in contact with metallic wiring (e.g., copper damascene wiring), it would be desirable to include SiN layers in the lower and/or upper portions of the multilayer dielectric structure, as opposed to SiNO layers, so as to prevent oxidation of the metallic wiring from SiNO layers in the multilayer dielectric stack. For example, in the embodiment shown in FIG. 2, the lower layers L1 and L2, and the upper layers L6, L7 and L8 of the multilayer dielectric structure 20 are formed of SiN, so that any metallic structure in contact with the upper and lower portions of the multilayer dielectric structure 20 will not be in contact with an SiNO layer, thereby preventing oxidation of a metallic structure at an interface between the metallic structure and an SiNO layer. The multilayer dielectric structure 30 of FIG. 3, which includes all SiNO layers, can be used in applications where oxidation of structures in contact with the multilayer dielectric structure 30 will not occur or is of no concern with regard to possible degraded performance. Furthermore, in the embodiments shown in FIGS. 4 and 5, alternating the SiN and SiNO layers throughout the multilayer dielectric structure (or a portion thereof) provides an added benefit of enhancing the barrier properties (e.g., prevent copper diffusion) of the multilayer dielectric structure for reasons discussed above with regard to FIG. 6C.

Figure 7:
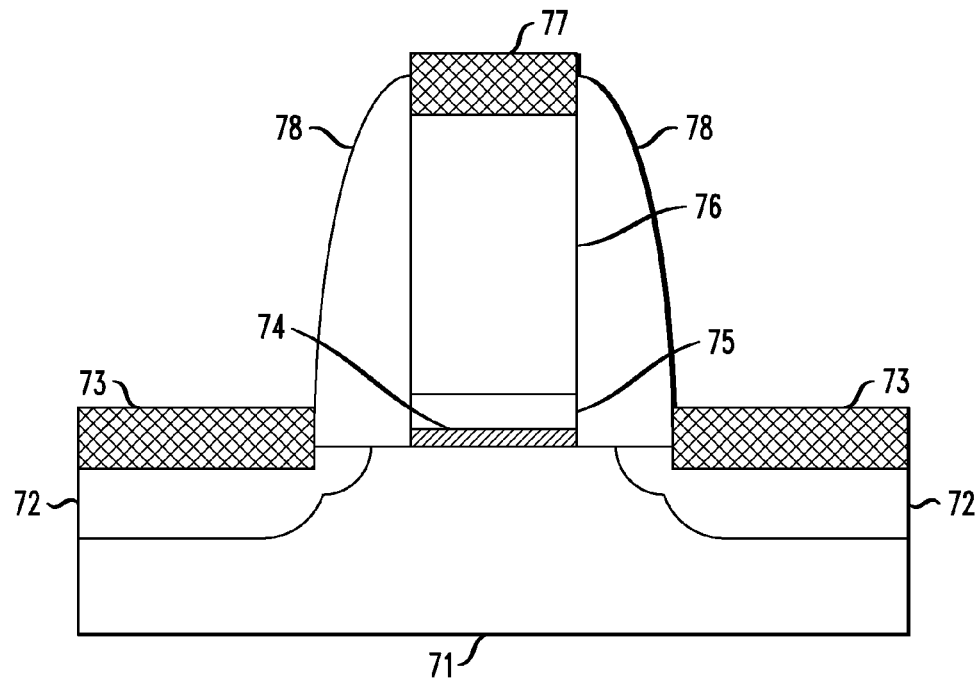
FIG. 7 is a schematic side-view of a transistor device having a spacer element that is formed of a multilayer dielectric structure comprising conformal layers of SiN and SiNO, according to an embodiment of the invention.

As further noted above, a multilayer SiN/SiNO dielectric structure according to an embodiment of the invention can be used in various nano-device structures as capping layers, liners, spacer barrier layers, and etch stop layers; etc., in BEOL and FEOL applications. For example, FIG. 7 is a schematic side-view of a transistor device having a spacer element that is formed of a multilayer dielectric structure comprising a stack of conformal layers of SiN and SiNO, according to an embodiment of the invention. In particular, FIG. 7 shows a field effect transistor 70 comprising a substrate 71, source/drain electrodes each comprising a doped region 72 and a silicide contact 73. The field effect transistor 70 further comprises a gate stack structure comprising an insulating layer 74 (or gate dielectric layer) formed on the substrate 71, and a gate electrode comprising a metallic layer 75 formed on the insulating layer 74, a polysilicon layer 76 formed on the gate metal layer 75, and a silicide contact 77 (or polycide contact) formed on the polysilicon layer 76. The gate structure is surrounded by an insulating sidewall spacer 78. In accordance with an exemplary embodiment of the invention, the insulating sidewall spacer 78 can be a multilayer SiN/SiNO dielectric structure that is formed using techniques as discussed below with reference to FIG. 12, as part of a FEOL fabrication process that is used to construct spacer structures for FETs.

Figure 8:
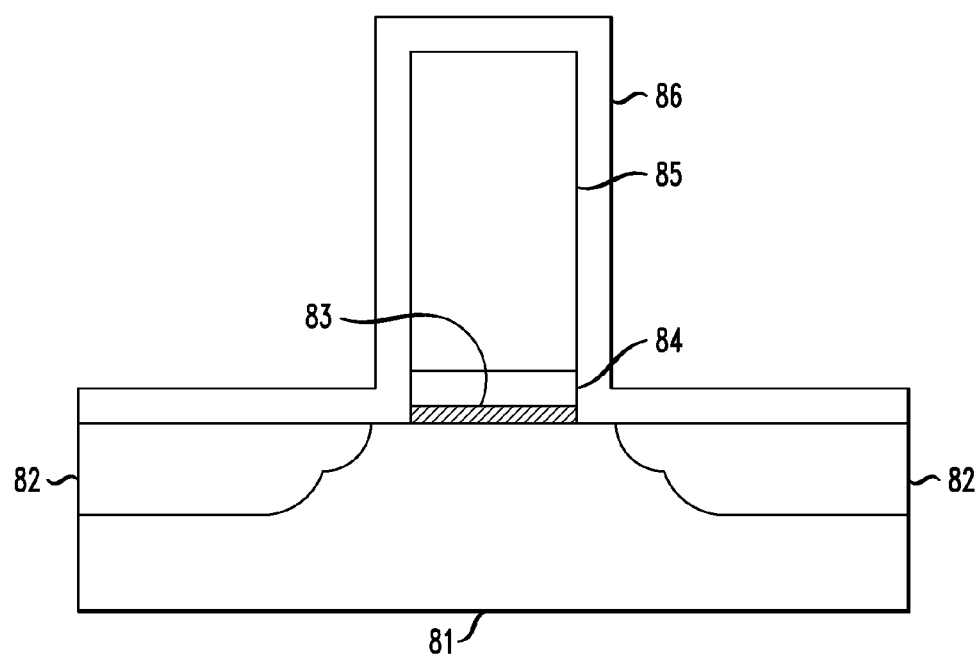
FIG. 8 is a schematic side-view of a transistor device having stress liner that is formed of a multilayer dielectric structure comprising conformal layers of SiN and SiNO, according to an embodiment of the invention.

FIG. 8 is a schematic side-view of a transistor device having stress liner that is formed of a multilayer dielectric structure comprising conformal layers of SiN and SiNO, according to an embodiment of the invention. In particular, FIG. 8 shows a field effect transistor 80 comprising a substrate 81 with doped source/drain regions 82. The field effect transistor 80 further comprises a gate stack structure comprising an insulating layer 83 (or gate dielectric layer) formed on the substrate 81, and a gate electrode comprising a metallic layer 84 formed on the insulating layer 83, and a polysilicon layer 85 formed on the gate metal layer 84. The field effect transistor 80 further comprises a stress-imparting dielectric structure 86 that is conformally formed over the FET device 80 to impart a stress thereto for enhancing the conductivity of a transistor, for example, an NFET or a PFET device. As is known in the art, SiN is one material, among others, which can be deposited in such way that the resulting material layer imparts either a tensile stress or a compressive stress to a layer of material with which it is in contact. To improve the conductivity of both an NFET and a PFET, a tensile stress-imparting dielectric structure 86 can be formed to cover an NFET device region and a compressive stress-imparting dielectric structure 86 can be formed to cover a PFET device region. In accordance with an exemplary embodiment of the invention, the stress-imparting dielectric structure 86 can be a multilayer SiN/SiNO dielectric structure that is formed using techniques as discussed below with reference to FIG. 12, as part of a FEOL fabrication process that is used to stress-imparting dielectric layers for FETs.

Figure 9:
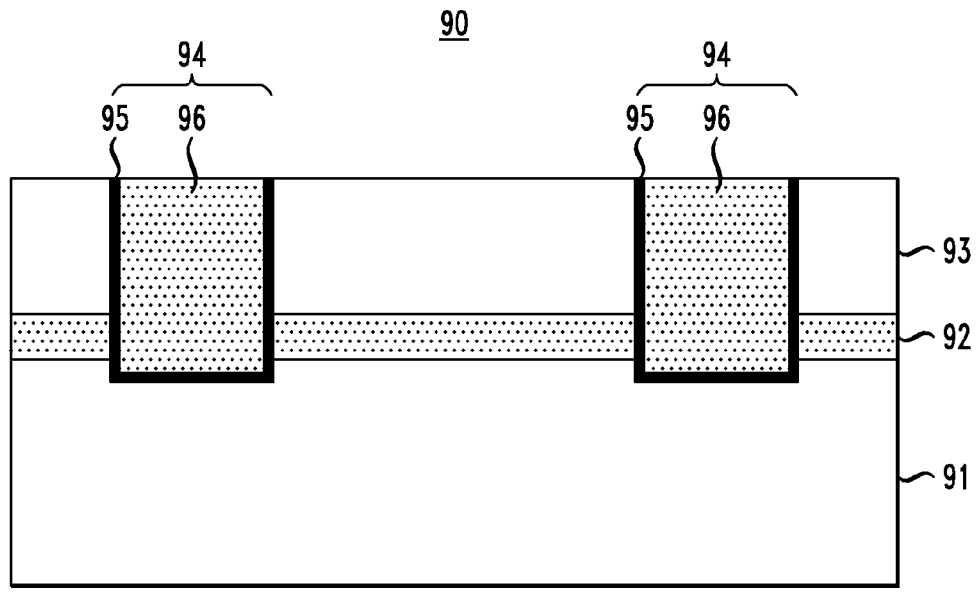
FIG. 9 is a schematic side-view of shallow trench isolation structures having a liner/barrier layer that is formed of a multilayer dielectric structure comprising conformal layers of SiN and SiNO, according to an embodiment of the invention.

FIG. 9 is a schematic side-view of shallow trench isolation structures having a liner/barrier layer that is formed of a multilayer dielectric structure comprising conformal layers of SiN and SiNO, according to an embodiment of the invention. In particular, FIG. 9 shows a semiconductor structure 90 comprising a silicon-on-insulator (SOI) semiconductor substrate comprising a first silicon layer 91, an insulating layer 92 (e.g., oxide layer) and a second silicon layer 93. FIG. 9 further shows a plurality of shallow trench isolation (STI) structures 94, which are formed between active areas in which electrical devices such as transistors or memory cells are to be formed. Each STI structure 94 comprises a trench that is formed through substrate layers 93 and 92 down to an upper portion of the first silicon layer 91, a barrier/insulating layer 95 lining the sidewalls and bottom walls of each trench, and an oxide fill 96 (e.g., HDPCVD oxide) filling the trench. In accordance with an exemplary embodiment of the invention, the barrier/insulating layer 95 that are used to line the trenches of the STI structures 94 can be multilayer SiN/SiNO dielectric structures that are formed using techniques as discussed below with reference to FIG. 12, as part of a FEOL fabrication process used to fabricate STI structures.

Figure 10:
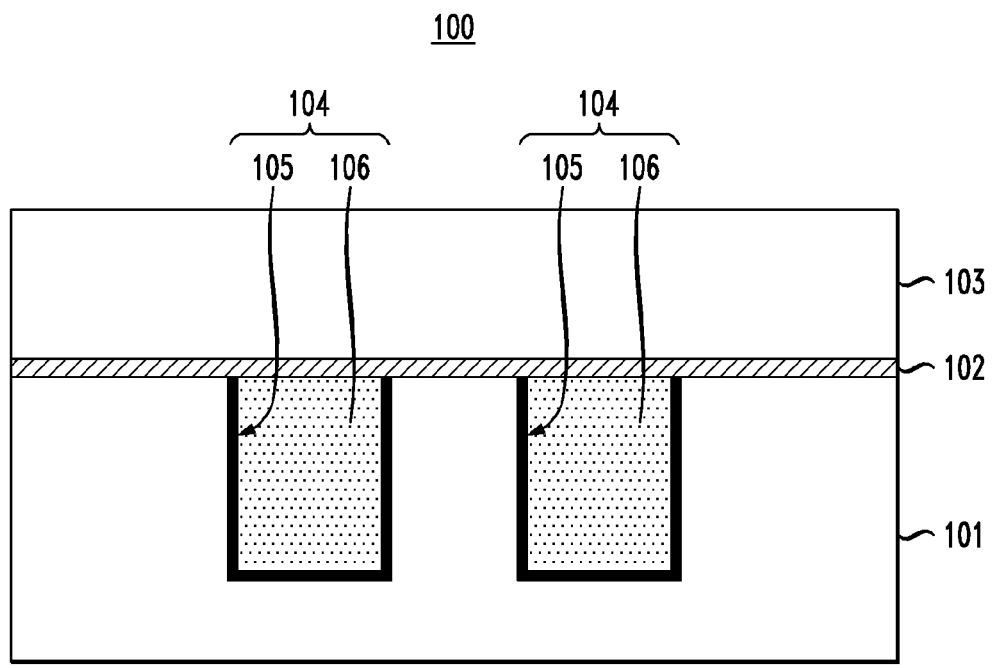
FIG. 10 is a schematic side-view of a BEOL structure having copper damascene wiring formed in an inter-level dielectric layer with a conformal capping layer formed over the inter-level dielectric layer and an exposed surface regions of the copper damascene wiring, wherein the capping layer is formed of a multilayer dielectric structure comprising conformal layers of SiN and SiNO, according to an embodiment of the invention.

FIG. 10 is a schematic side-view of a BEOL (back-end-of-line) structure having copper damascene wiring formed in an inter-level dielectric layer with a conformal capping layer formed over the inter-level dielectric layer an exposed surface regions of the copper damascene wiring, wherein the capping layer is formed of a multilayer dielectric structure comprising conformal layers of SiN and SiNO, according to an embodiment of the invention. In particular, FIG. 10 shows a BEOL structure 100 comprising a first inter-level dielectric layer 101, a capping layer 102, a second inter-level dielectric layer 103, and plurality of wiring structures 104 formed in the first inter-level dielectric layer 101. Each wiring structure 104 comprises a trench that is formed in an upper portion of the first inter-level dielectric layer 101, a barrier/insulating layer 105 lining the sidewalls and bottom walls of each trench, and a metallic material 106 (e.g., copper) filling the trench to form electrical wiring which forms a portion of a BEOL interconnect network. In accordance with an exemplary embodiment of the invention, the capping layer 102 can be multilayer SiN/SiNO dielectric structures that are formed using techniques as discussed below with reference to FIG. 12, as part of a BEOL fabrication process used to fabricate BEOL wiring networks. The capping layer 102 is employed on the top surface of the inter-level dielectric layer 101 (e.g., a low-k dielectric layer) to prevent the diffusion of Cu atoms from the copper wire 106 into the dielectric layer 103, or otherwise employed as a barrier layer to prevent oxidation of the copper wiring 106.

Figure 11:
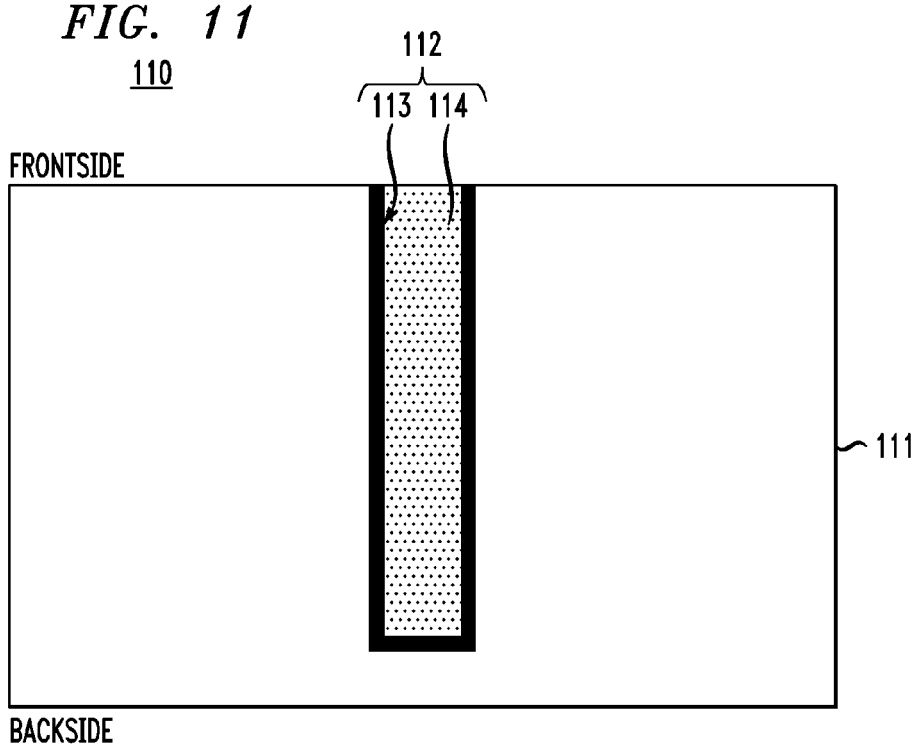
FIG. 11 is a schematic side-view of semiconductor substrate having a through silicon via with a barrier/liner layer formed of a multilayer dielectric structure comprising conformal layers of SiN and SiNO, according to an embodiment of the invention.

FIG. 11 is a schematic side-view of semiconductor substrate having a through-silicon via with a barrier/liner layer formed of a multilayer dielectric structure comprising conformal layers of SiN and SiNO, according to an embodiment of the invention. In particular, FIG. 11 shows a semiconductor structure 110 comprising a semiconductor substrate 111 having a "backside" (inactive surface) and a "front side" (active surface), with a through-silicon via (TSV) structure 112 formed in the semiconductor substrate 111 from the front side to the backside. The TSV structure 112 comprises a deep trench structure formed by an anisotropic deep reactive-ion etch (DRIE) process, a conformal liner layer 113 lining the sidewall and bottom wall of the deep trench, and a copper material 114 filling the deep trench (e.g., filled with electroplated copper). The liner layer 113 electrically insulates the TSV structure 112 from the substrate 111 and prevents Cu diffusion into the silicon substrate 111. Once the TSV structure 112 shown in FIG. 11 is formed, a backside process is performed to grind down the backside of the silicon substrate 111 and expose the bottom portion of the TSV structure 112, followed by further processing steps to build structures that enable connection to the backside end of the TSV structure 112. In accordance with an embodiment of the invention, the liner 113 can be a multilayer SiN/SiNO dielectric structure that is formed using techniques as discussed below with reference to FIG. 12, as part of a TSV fabrication process used to fabricate the TSV structure 112.

Figure 12:
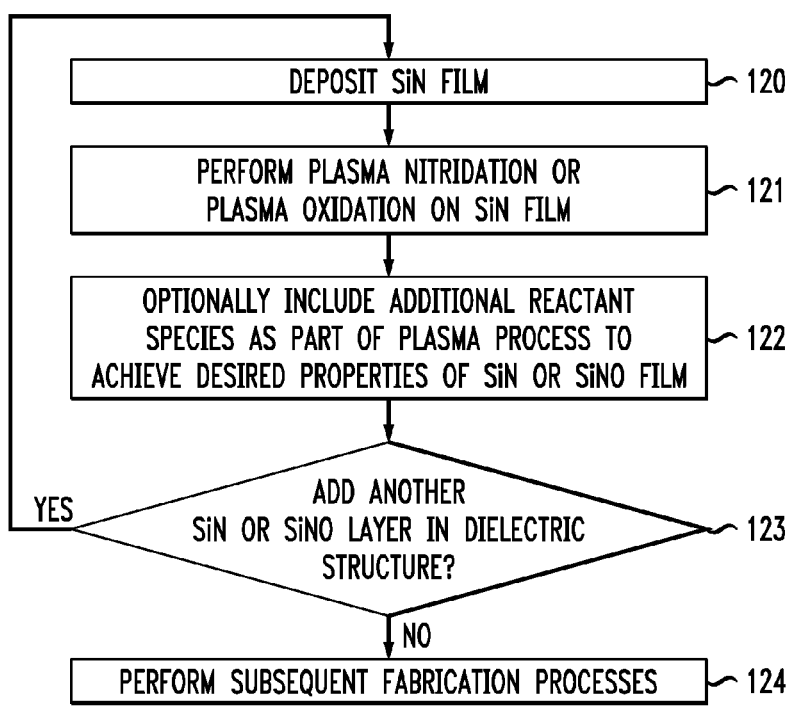
FIG. 12 is a flow diagram of a method for fabricating a multilayer dielectric structure, according to an embodiment of the invention.

FIG. 12 is a flow diagram of a method for fabricating a multilayer dielectric structure, according to an embodiment of the invention. In particular, FIG. 12 illustrates a method for fabricating a multilayer SiN/SiNO dielectric structure such as shown in FIG. 2, 3, 4 or 5, for example. The process begins with an initial step of depositing a SiN film (step 120). In one embodiment, the deposition of a conformal SiN dielectric film is performed with a mixture of $SiH_4$ and $NH_3$ reactant gases at suitable standard cubic centimeters per minute (SCCM) flow rates, and using a low RF power and low temperature PECVD process or plasma enhanced atomic layer deposition (PE-ALD) process to form a conformal layer of SiN having a thickness in a range of about 0.5 nm to about 3 nm. For example, in one embodiment, the SiN deposition process is performed at a temperature of less than about 450 degrees Centigrade, and a radio frequency power of less than about 2 watts per square centimeter, with a radio frequency ranging from about 400 KHz to about 60 MHz. This deposition process results in the formation of an ultrathin, highly conformal SiN film.

Next, depending on whether the recently deposited conformal SiN film will be a SiN layer or a SiNO layer in the stack structure, either a plasma nitridation process or a plasma oxidation process will be performed (step 121). For SiN layers, a modulated RF plasma nitridation process is performed on the deposited SiN film In one embodiment, plasma nitridation is performed using a nitrogen bearing reactant gas such as $N_2$ or $NH_3$, along with an inert gas such as Argon (Ar) or Helium (He). The plasma nitridation process serves to make the thin SiN film more dense by low energy plasma ion bombardment, and to change a stress characteristic of the thin SiN film (compressive⇌tensile). Moreover, the plasma nitridation process can serve to adjust other characteristics of the thin SiN film such as, e.g., increase a breakdown voltage, reduce leakage, and/or slightly lower the dielectric constant, k, of the SiN film. For SiNO layers, in one embodiment, plasma oxidation process is performed using an oxygen bearing reactant gas such as $N_2O$ or $O_2$, along with an inert gas such as Argon (Ar) or Helium (He). The nitridation and oxidation processes result in smoother and denser films.

In another embodiment, an additional reactant species can be optionally included as part of the plasma nitridation or oxidation process to achieve other desired properties of the resulting SiN or SiNO layer (step 122). For example, the SiN/SiNO film composition can be modified, or varied or improved by changing the band gap of the film, or other electronic and mechanical properties. In one embodiment, this can be done during the plasma surface treatment steps where one or more of Phosphorus (P), Fluorine (F), Boron (B), or Carbon (C) bearing reactants can be used as reactive treatment gases to modify the SiN/SiNO by inserting P, F, B, and/or C atoms into the film to achieve desirable film properties.

If another layer of SiN or SiNO is to be formed as part of the process for fabricating a multilayer SiN/SiNO dielectric structure (affirmative determination in step 123), then the process of steps 120, 121 and optionally 122 are performed for each SiN or SiNO layer to be added to the multilayer SiN/SiNO dielectric structure. Once fabrication of the multilayer SiN/SiNO dielectric structure is complete and no other SiN or SiNO layers are to be added (negative determination in step 123), subsequent fabrication processes are performed to complete construction of the target semiconductor structure being formed. For instance, if the multilayer SiN/SiNO dielectric structure is a liner layer in a STI structure or BEOL wiring structure, subsequent processing steps would include dielectric and metallic material fill processes, such as discussed with reference to FIGS. 9 and 10, for example.

It is to be understood that the invention is not limited to the particular materials, features, and structures specifically shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. However, one of ordinary skill in the art will readily recognize those features omitted from these generalized descriptions.

Further embodiments of the invention include integrated circuits with various analog and digital circuitry. In particular, integrated circuit dies can be fabricated having semiconductor structures and devices such as a field-effect transistors, bipolar transistors, metal-oxide-semiconductor transistors, diodes, resistors, capacitors, inductors, etc., forming analog and/or digital circuits, in which various embodiments of multilayer SiN/SiNO dielectric structures may be employed. The semiconductor devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of embodiments of the invention.

Although embodiments of the invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor structure, comprising:
    a BEOL (back end of line) interconnect structure comprising a metal line;
    a conformal multilayer barrier structure formed on the metal line, wherein the conformal multilayer barrier structure comprises:
        a first multilayer structure comprising a plurality of stoichiometric, insulating silicon nitride (SiN) layers formed directly on the metal line, wherein each SiN layer in the first multilayer structure is in direct contact with at least one other SiN layer in the first multilayer structure; and
        a second multilayer structure formed directly on the first multilayer structure, wherein the second multilayer structure comprises a plurality of insulating silicon oxynitride (SiNO) layers, wherein the SiNO layers are in-situ oxidized SiN layers with a varying oxygen composition profile, wherein each SiNO layer in the second multilayer structure is in direct contact with at least one other SiNO layer in the second multilayer structure;
        wherein each SiN and SiNO layer in the first and second multilayer structures has a thickness of less than or equal to about 2 nanometers.

2. The semiconductor structure of claim 1, further comprising a third multilayer structure, formed directly on the second multilayer structure, wherein the third multilayer structure comprises a plurality of stoichiometric, insulating SiN layers.

3. The semiconductor structure of claim 1, wherein one or more SiN or SiNO layers of the conformal multilayer barrier structure comprise a varying composition of Phosphorus (P), Fluorine (F), Boron (B), or Carbon (C) atoms, or a combination thereof.

4. The semiconductor structure of claim 1, wherein the conformal multilayer barrier structure provides a step coverage with a conformality of about 70 percent or greater.

5. The semiconductor structure of claim 1, wherein the conformal multilayer barrier structure has an effective dielectric constant of less than about 6.5 and greater than about 4.0.

6. The semiconductor structure of claim 1, wherein the BEOL structure comprises a copper damascene wire formed in an ILD (inter-level dielectric) layer, and wherein the conformal multilayer barrier structure is a capping layer that is disposed on the ILD layer and on an exposed surface of the copper damascene wire.

7. An integrated circuit device comprising the semiconductor structure as recited in claim 1.

8. A semiconductor structure, comprising:
    a conformal multilayer barrier structure consisting only of a plurality (n) of insulating silicon oxynitride (SiNO) layers, wherein n is an integer that is greater than 3, wherein each insulating SiNO layer is a separately deposited and in-situ oxidized SiN layer with a varying oxygen composition profile,
    wherein each insulating SiNO layer of the conformal multilayer barrier structure has a thickness of less than or equal to about 2 nanometers,
    wherein at least one insulating SiNO layer in the conformal multilayer barrier structure is disposed between and in direct contact with at least two other insulating SiNO layers in the conformal multilayer barrier structure, and
    wherein the conformal multilayer barrier structure serves as a barrier layer disposed between two layers or elements of the semiconductor structure.

9. The semiconductor structure of claim 8, wherein a total thickness of the conformal multilayer barrier structure is about 25 nanometers or less.

10. The semiconductor structure of claim 8, wherein one or more of the insulating SiNO layers comprise a varying composition of Phosphorus (P), Fluorine (F), Boron (B), or Carbon (C) atoms, or a combination thereof.

11. The semiconductor structure of claim 8, wherein the conformal multilayer barrier structure provides a step coverage with a conformality of about 70 percent or greater.

12. The semiconductor structure of claim 8, wherein the semiconductor structure comprises a transistor device, and wherein the conformal multilayer barrier structure is a spacer formed on a sidewall of a gate structure of the transistor device.

13. The semiconductor structure of claim 8, wherein the semiconductor structure comprises a transistor device, and wherein the conformal multilayer barrier structure is a stress liner layer conformally formed over the transistor device to impart a tensile or compressive stress.

14. The semiconductor structure of claim 8, wherein the semiconductor structure comprises a trench isolation structure formed in a semiconductor substrate, wherein the conformal multilayer barrier structure is conformally formed to line a sidewall and bottom surface of an etched trench of the trench isolation structure.

15. The semiconductor structure of claim 8, wherein the semiconductor structure comprises a through-silicon via (TSV) structure formed in a semiconductor substrate, wherein the conformal multilayer barrier structure is a liner of the TSV structure.

* * * * *